(12) United States Patent
Wu et al.

(10) Patent No.: US 7,913,209 B1
(45) Date of Patent: Mar. 22, 2011

(54) DETERMINING A CYCLE BASIS OF A DIRECTED GRAPH

(75) Inventors: Kang Wu, Fort Collins, CO (US); Neil G. Jacobson, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 486 days.

(21) Appl. No.: 12/047,663

(22) Filed: Mar. 13, 2008

(51) Int. Cl.
*G06F 17/50* (2006.01)
*G06F 7/00* (2006.01)

(52) U.S. Cl. .......... 716/106; 716/105; 716/136; 703/14; 703/2; 707/708; 707/797; 707/798

(58) Field of Classification Search .................. 716/1, 5, 716/7, 105, 106, 136; 703/1, 2, 3, 6, 14; 707/708, 797, 798
See application file for complete search history.

(56) References Cited

U.S. PATENT DOCUMENTS

| | | | | |
|---|---|---|---|---|
| 5,522,063 | A * | 5/1996 | Ashar et al. | 716/4 |
| 5,889,999 | A * | 3/1999 | Breternitz et al. | 717/158 |
| 6,282,681 | B1 * | 8/2001 | Sun et al. | 714/738 |
| 6,381,739 | B1 * | 4/2002 | Breternitz et al. | 714/37 |
| 6,804,634 | B1 * | 10/2004 | Holzmann et al. | 703/2 |
| 6,879,946 | B2 * | 4/2005 | Rong et al. | 703/2 |
| 7,693,690 | B2 * | 4/2010 | Wang et al. | 703/2 |
| 2007/0044084 | A1 * | 2/2007 | Wang et al. | 717/151 |
| 2009/0222249 | A1 * | 9/2009 | Wang et al. | 703/13 |

OTHER PUBLICATIONS

Liu, Hongbo et al., "A New Way To Enumerate Cycles in Graph", Telecommunications, 2006 AICT-ICIW apos; 06. International Conference on Internet and Web Applications and Services, Feb. 19-26, 2006, 3 pages.
Liebchen, Christian, et al., "A Greedy Approach To Compute A Minimum Cycle Basis Of A Directed Graph", Inf. Process. Lett 94(3): 107-112 Jan. 20, 2005, 17 pages.
Tarjan, R. "Enumeration Of The Elementary Circuits Of A Directed Graph", Department of Computer Science, Cornell University, TR 72-145, Sep. 1972, 15 pages.
Johnson, D.B., "Find All The Elementary Circuits Of A Directed Graph", J.Siam, 4:77-84, 1975, http://scitation.aip.org, (Abstract).

* cited by examiner

*Primary Examiner* — Phallaka Kik
(74) *Attorney, Agent, or Firm* — LeRoy D. Maunu

(57) ABSTRACT

A cycle basis is efficiently determined for a directed graph. A first depth-first search of the directed graph classifies each of the edges of the directed graph to have a type that is one of a within-tree type for an edge within a tree of the first depth first search, a forward type for an edge skipping forward along the tree, a back type for an edge directed back along the tree, or a cross type for an edge between two subtrees of the tree. A second depth-first search of the directed graph determines a respective cycle for each of the edges of the back type. A third depth-first search of the directed graph determines a respective cycle for each of the edges of the cross type that is included a cycle. The basis is output the basis that specifies each of the respective cycles.

20 Claims, 8 Drawing Sheets

DETERMINING A CYCLE BASIS OF A DIRECTED GRAPH

FIELD OF THE INVENTION

The present invention generally relates to graph theory, and more particularly to analysis of cycles in a directed graph.

BACKGROUND

Directed graphs are an important abstraction for modeling various applications. For example, an electronic circuit can be modeled with a directed graph having nodes for the circuit elements of the electronic circuit and directed edges for the connections between the circuit elements. The abstraction of the directed graph permits analysis of the modeled application using graph processing techniques.

One graph processing technique is the topological analysis of determining the cycles of the directed graph. For an example directed graph modeling an electronic circuit, the cycles of the directed graph identify the feedback paths of the electronic circuit. Thus, the cycles are extracted from the directed graph to determine the feedback paths of the electronic circuit. The extracted cycles of the example directed graph are analyzed further to determine the specific characteristics of the feedback paths.

For a directed graph having a large number of cycles, it is time consuming and difficult to determine the cycles in the directed graph. In addition, the analysis of the extracted cycles is also time consuming and difficult. There is a general need to improve the efficiency of extracting the cycles of a directed graph and to improve the efficiency of analyzing the extracted cycles.

The present invention may address one or more of the above issues.

SUMMARY

Various embodiments of the invention determine a basis for the cycles within a directed graph. A first depth-first search of the directed graph classifies each of the edges of the directed graph to have a type that is one of a within-tree type for an edge within a tree of the first depth first search, a forward type for an edge skipping forward along the tree, a back type for an edge directed back along the tree, or a cross type for an edge between two subtrees of the tree. A second depth-first search of the directed graph determines a respective cycle for each of the edges of the back type. This respective cycle is a cycle of the edge of the back type and at least one edge of the within tree type. A third depth-first search of the directed graph determines a respective cycle for each of the edges of the cross type that is included a cycle. This respective cycle is a cycle of the edge of the cross type and a plurality of edges of the within-tree, back, or cross types. The basis is output that specifies each of the respective cycles.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

In various embodiments, a cycle basis for a directed graph is a set of cycles from the directed graph, such that every cycle of the directed graph is a linear combination of the cycles in the set, and the cycles in the set are linearly independent because no cycle in the set is a linear combination of the other cycles in the set. For certain applications, such as determining the characteristics of feedback paths in an electronic circuit, the cycle basis captures the essential characteristics of all of the cycles in the directed graph. Thus, efficiency is improved because there are a reduced number of cycles that need to be extracted from the directed graph, and efficiency is further improved because there are a reduced number of cycles that need to be analyzed. In addition, certain embodiments efficiently extract the cycle basis using an amount of computation that is proportional to the sizes of the directed graph and the cycle basis.

Figure 1:
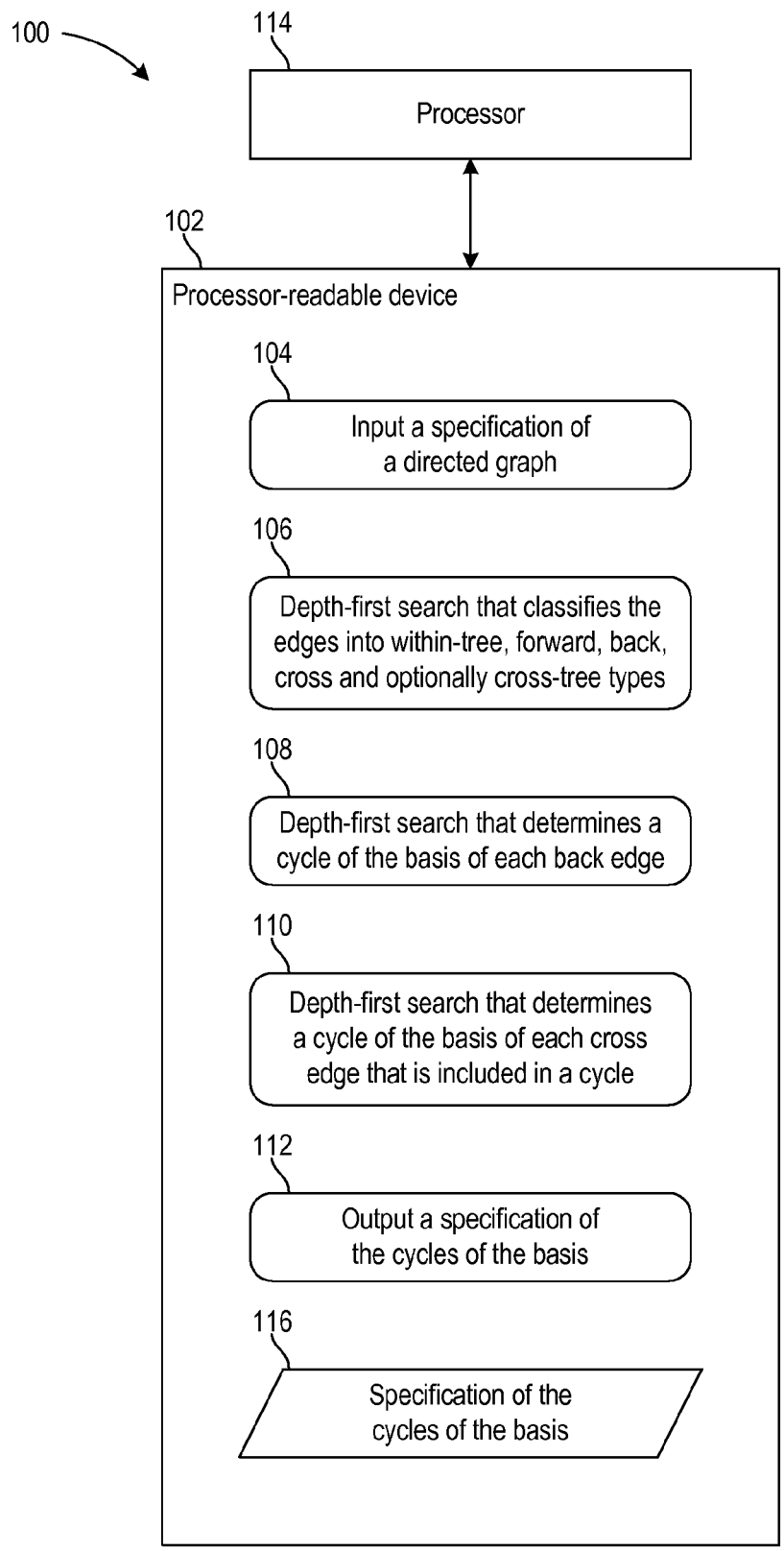
FIG. 1 is a block diagram of a system for determining a cycle basis of a directed graph in accordance with various embodiments of the invention.

FIG. 1 is a block diagram of a system 100 for determining a cycle basis of a directed graph in accordance with various embodiments of the invention. A processor-readable device 102 is configured with software modules 104, 106, 108, 110, and 112 for determining the cycle basis of the directed graph.

Execution of the instructions of software module 104 causes processor 114 to input a specification of a directed graph having nodes and directed edges.

Execution of the instructions of software module 106 causes processor 114 to perform a depth-first search that classifies the type of each directed edge. Each edge is classified to be a tree edge within a search tree of the depth-first search, a forward edge skipping forward along the tree, a back edge directed back along the tree, or a cross edge. In one embodiment, execution of the instructions of software module 106 also causes processor 104 to classify certain edges to be cross-tree edges.

Execution of the instructions of software module 108 causes processor 114 to perform a depth-first search that determines a cycle of the basis for each back edge. Execution of the instructions of software module 110 causes processor 114 to perform a depth-first search that determines a cycle of the basis for each cross edge that is included in some cycle.

Execution of the instructions of software module 112 causes processor 114 to output a specification of the cycles of the basis. In one embodiment, the specification 116 of the basis is output to processor-readable device 102 or another memory of the computing system 100.

In one embodiment, software modules 104 through 112 efficiently generate a cycle basis. The amount of computation required for executing software modules 104 through 112 is linear in the number of nodes of the directed graph, the number of edges in the directed graph, and the number of edges in the cycles of the basis.

In one embodiment, system 100 provides means for performing certain depth-first searches by executing software modules 106, 108, and 110, and a means for outputting the basis of the cycles of the directed graph by executing software module 112.

Figure 2:
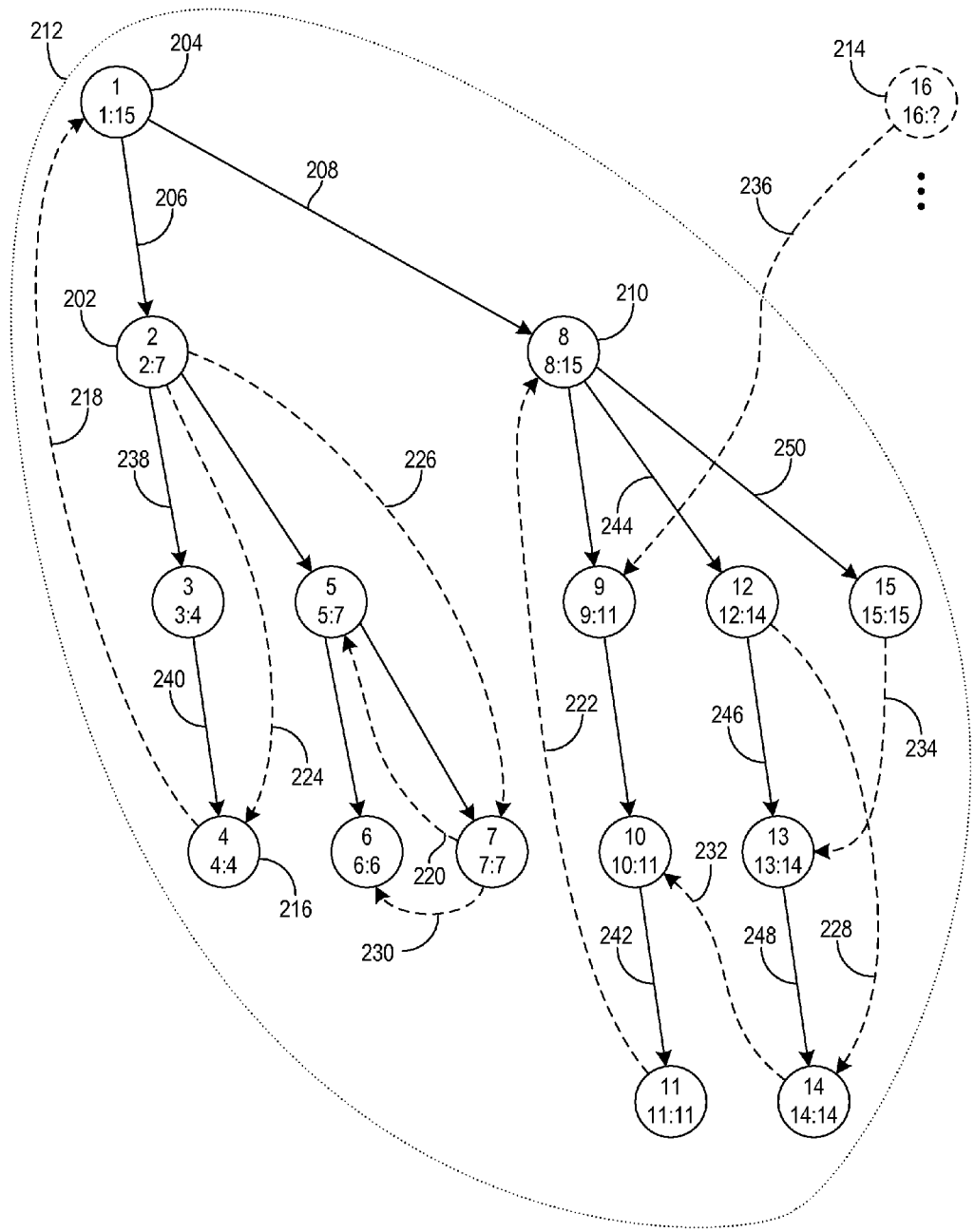
FIG. 2 is a diagram of an example directed graph having a cycle basis determined in accordance with various embodiments of the invention.

FIG. 2 is a diagram of an example directed graph having a cycle basis determined in accordance with various embodiments of the invention. Each node of the directed graph has a label that includes an ordinal number identifying the position of the node in an order of visiting the nodes during a depth-first search. The label of each node also includes the range of the subtree rooted at the node. For example, node 202 has a label of "2 2:7" indicating node 202 is the second node visited during the depth-first search and the subtree rooted at node 202 inclusively includes the second through seventh nodes visited during the depth-first search. Tree edges are shown with solid arrows and back, forward, cross, and cross-tree edges are shown with dashed arrows. The nodes are arranged vertically according to the levels of the nodes in the search trees of the depth-first search and the nodes are arranged horizontally according to the order of visiting the nodes.

Various embodiments of the invention begin by classifying the types of the directed edges using a depth-first search. The depth-first search begins at a node 204. In one embodiment, a visited flag associated with each node is initially cleared and a node with a cleared visited flag is selected as the current node 204. Current node 204 is marked as visited and current node 204 is expanded by determining the directed edges 206 and 208 that originate at current node 204 and terminate at previously unvisited nodes 202 and 210. Node 202 becomes the current node and is similarly marked as visited and expanded before node 210 using, for example, recursion. The process of expanding previously unvisited nodes continues until the subset 212 (not including edge 236) is determined of all nodes and edges reachable from the initial node 204.

In one embodiment, the directed graph has the property that all nodes and edges are reachable from the initial node. In another embodiment, the directed graph has a node 214 that is not reachable from the initial node 204. If any unvisited nodes remain after finding all nodes reachable from an initial node 204, one of these unvisited nodes is selected and the depth-first search continues. Each time unvisited nodes remain after finding all nodes reachable from a selected node, another unvisited node is selected and the depth-first search continues.

Each directed edge from the current node to a previously unvisited node is a tree edge. The tree edges are shown in FIG. 2 with solid arrows, for example, tree edges 206 and 208. The nodes and tree edges in subset 212 define a search tree of the depth-first search rooted at the initial node 204. Another search tree of the depth-first search is rooted at node 214. The search trees have levels as indicated by the vertical positioning of the nodes in FIG. 2. Each tree edge is directed to a node in the next lower level. For example, edge 206 is directed from node 204 at the first level to node 202 at the second level. The nodes in FIG. 2 are also arranged horizontally according to the order of visiting the nodes during the depth-first search. Because during the depth-first search each tree edge is traversed to visit a previously unvisited node, each tree edge is directed toward the right in FIG. 2. Thus, every tree edge is generally directed down one level and toward the right in FIG. 2.

When node 216 is expanded, edge 218 is found that connects to an already visited node 204. Thus, edge 218 is not a tree edge; instead, edge 218 is a back edge. A back edge is an edge directed from a node to an ancestor of the node in a search tree. Because the range "1:15" of node 204 includes the visitation ordinal "4" of node 216, node 204 is readily determined to be an ancestor of node 216. Edges 220 and 222 are also back edges. Every back edge is generally directed up and to the left in FIG. 2 and parallels, in a reverse direction, a connected sequence of tree edges. Every cycle of a directed graph generally includes at least one back edge.

A forward edge is an edge directed from a node to a descendant of the node. Edges 224, 226, and 228 are forward edges. Every forward edge is generally directed down multiple levels and toward the right in FIG. 2 and parallels a connected sequence of tree edges. A forward edge is a "short cut" for the parallel connected sequence of tree edges.

A cross edge is an edge directed between two nodes of a search tree and the edge is not a tree edge, a back edge, or a forward edge. A cross edge connects two nodes from different subtrees of a search tree. Edges 230, 232, and 234 are cross edges. Each cross edge is generally directed toward the left in FIG. 2 and can be directed down to a lower level as illustrated by cross edge 234, up to a higher level as illustrated by cross edge 232, or horizontally to the same level as illustrated by cross edge 230.

A cross-tree edge is an edge directed from a node of one search tree to a node of another search tree. Edge 236 is a cross-tree edge. Each cross-tree edge is generally directed toward the left in FIG. 2 and can be directed down to a lower level as illustrated by cross-tree edge 236, up to a higher level, or horizontally to the same level. Generally, because cross-tree edges are directed toward the left and are the only connections between the trees of the depth-first search, it is not possible to create a cycle through a cross-tree edge. Thus, cross-tree edges are ignored in certain embodiments without a loss of generality in determining a cycle basis.

Generally, the cycle basis includes a cycle for every back edge and this cycle is the back edge together with the reverse-parallel connected sequence of tree edges. For example, the cycle basis includes the cycle through back edge 218 and the connected sequence of tree edges 206, 238, and 240. It will be appreciated that a cycle can be described by either the edges around the cycle or both the nodes and the edges around the cycle. In addition for directed graphs in many applications, a cycle can be described by the nodes around the cycle.

There might or might not be a cycle through a cross edge. For the example directed graph of FIG. 2, the cross edge 230 is not included in any cycle. Cross edge 232 is included in the cycle of edges 232, 242, 222, 244, 246, and 248, for example. Cross edge 234 is included in the cycle of edges 234, 248, 232, 242, 222, and 250. The cycle basis generally includes a cycle for every cross edge that is included in some cycle, and this basis cycle includes the cross edge.

There might or might not be a cycle through a forward edge. Forward edge 224 is included in the cycle of edges 224, 218, and 206. Forward edge 226 is not included in any cycle. Forward edge 228 is included in the cycle of edges 228, 232, 242, 222, and 244. In one embodiment, the cycle basis includes a cycle for every forward edge that is included in some cycle, and this basis cycle includes the forward edge. In another embodiment, the forward edges are unimportant during analysis of the characteristics of the cycles of the directed graph because the forward edges are a "short cut" for a connected sequence of tree edges, such that cycles through forward edges are ignored. In such an embodiment, the cycle basis is a basis of all of the cycles of the directed graph that do not include forward edges.

Figure 3:
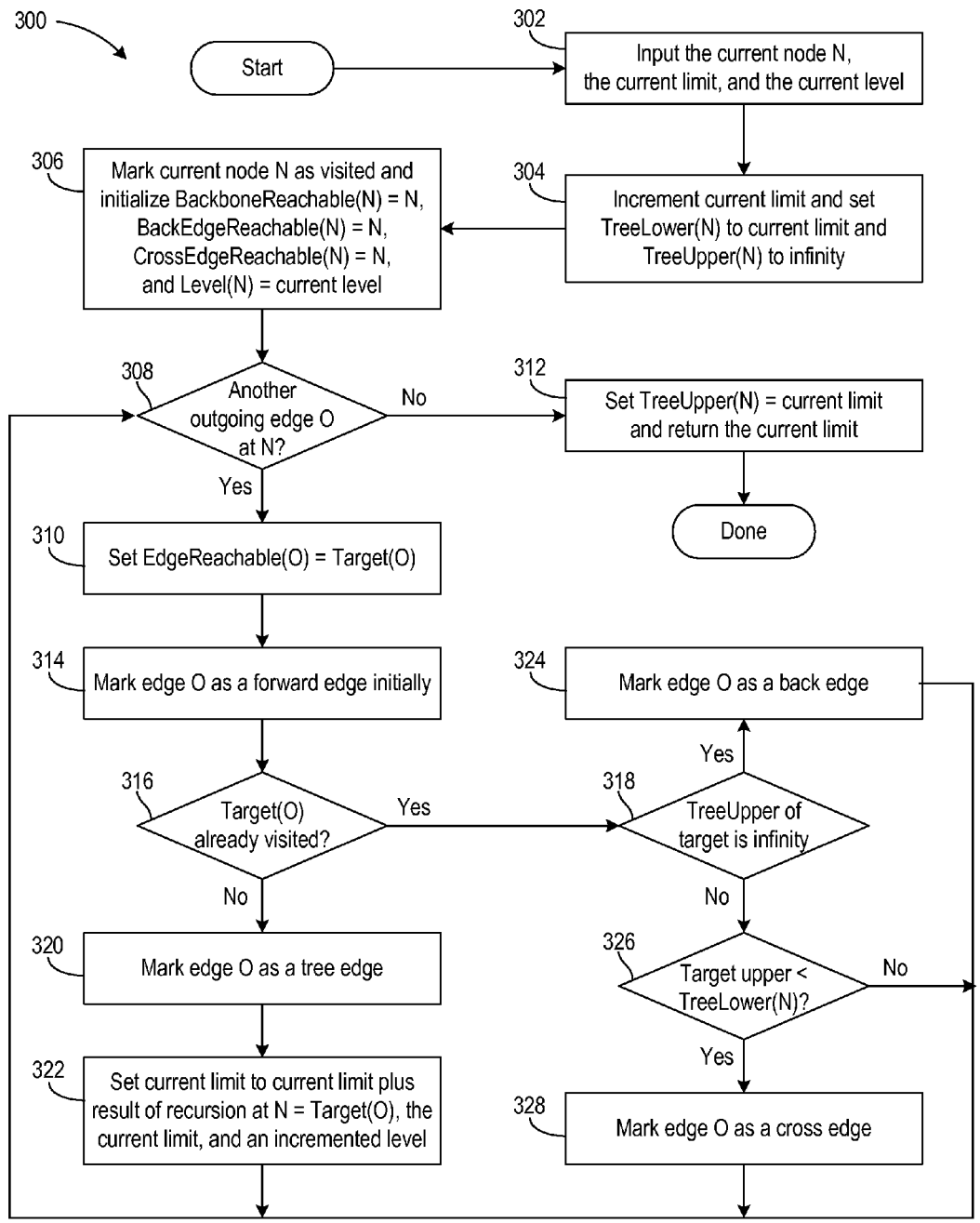
FIG. 3 is a flow diagram of a process for classifying edges of a directed graph in accordance with various embodiments of the invention.

FIG. 3 is a flow diagram of a process 300 for classifying edges of a directed graph in accordance with various embodiments of the invention. The edges are classified by type into tree edges, back edges, forward edges, and cross edges by the depth-first search of process 300. It will be appreciated that process 300 can be readily extended to additionally classify edges of the cross-tree type.

At step 302, process 300 inputs the current node, the number of already visited nodes, and the current level within the search tree. The number of already visited nodes is incremented at step 304 to form the lower limit for the range of the tree or subtree routed at the current node. The upper limit of the range is temporality initialized to infinity at step 304.

At step 306, the current node is marked as visited and certain parameters are initialized for the current node. BackboneReachable(N) is the highest node in the tree that is reachable from node N by traversing only back edges or tree edges in the path between the root node and node N. The highest node among a set of nodes is the node visited first during process 300; the highest node among a set of nodes in FIG. 2 is the node furthest to the left. BackEdgeReachable(N) is the highest node in the tree that is reachable from node N by traversing only back edges and tree edges. CrossEdgeReachable(N) is the highest node in the tree that is reachable from node N by traversing at least one cross edge. BackboneReachable(N), BackEdgeReachable(N), and CrossEdgeReachable(N) are initialized to the current node N. The level(N) of the current node N is set to the current level.

Decision 308 checks whether there is another outgoing edge at the current node. For another outgoing edge, process 300 proceeds to step 310; otherwise process 300 proceeds to step 312. Parameter EdgeReachable(O) provides guidance for each traversal. If O is a back edge, EdgeReachable(O) is the highest node reachable via edge O. If O is a tree edge, EdgeReachable(O) provides global guidance for cross edge traversal. If O is a cross edge, EdgeReachable(O) provides local guidance for cross edge traversal. At set 310, parameter EdgeReachable(O) of the current outgoing edge O is set to the target node of edge O. At step 314, the current outgoing edge of the current node is initially marked to be a forward edge.

Decision 316 checks whether the target of the current outgoing edge is already visited. If the target of the current outgoing edge is already visited, process 300 proceeds to decision 318; otherwise, process 300 proceeds to step 320. At step 320, the current outgoing edge is marked as a tree edge. At step 322, process 300 recursively invokes itself with the new current node set to the target of the current outgoing edge, the current limit, and an incremented level. The current limit is increased by the value returned from the recursive invocation of process 300.

Decision 318 checks whether the upper limit of the range of the target of the current node is infinity. If so, process 300 proceeds to step 324; otherwise, process 300 proceeds to decision 326. At step 324, the current outgoing edge is marked as a back edge. Decision 326 checks whether the upper limit of the range of the target is less than the lower limit of the range of the current node. If so, process 300 proceeds to step 328; otherwise, process 300 returns to decision 308 and the current outgoing edge remains marked as a forward edge from step 314. At step 328, the current outgoing edge is marked as a cross edge.

Step 312 sets the upper limit of the range of the current node to the current limit and process 300 returns the value of the current limit.

Figure 4:
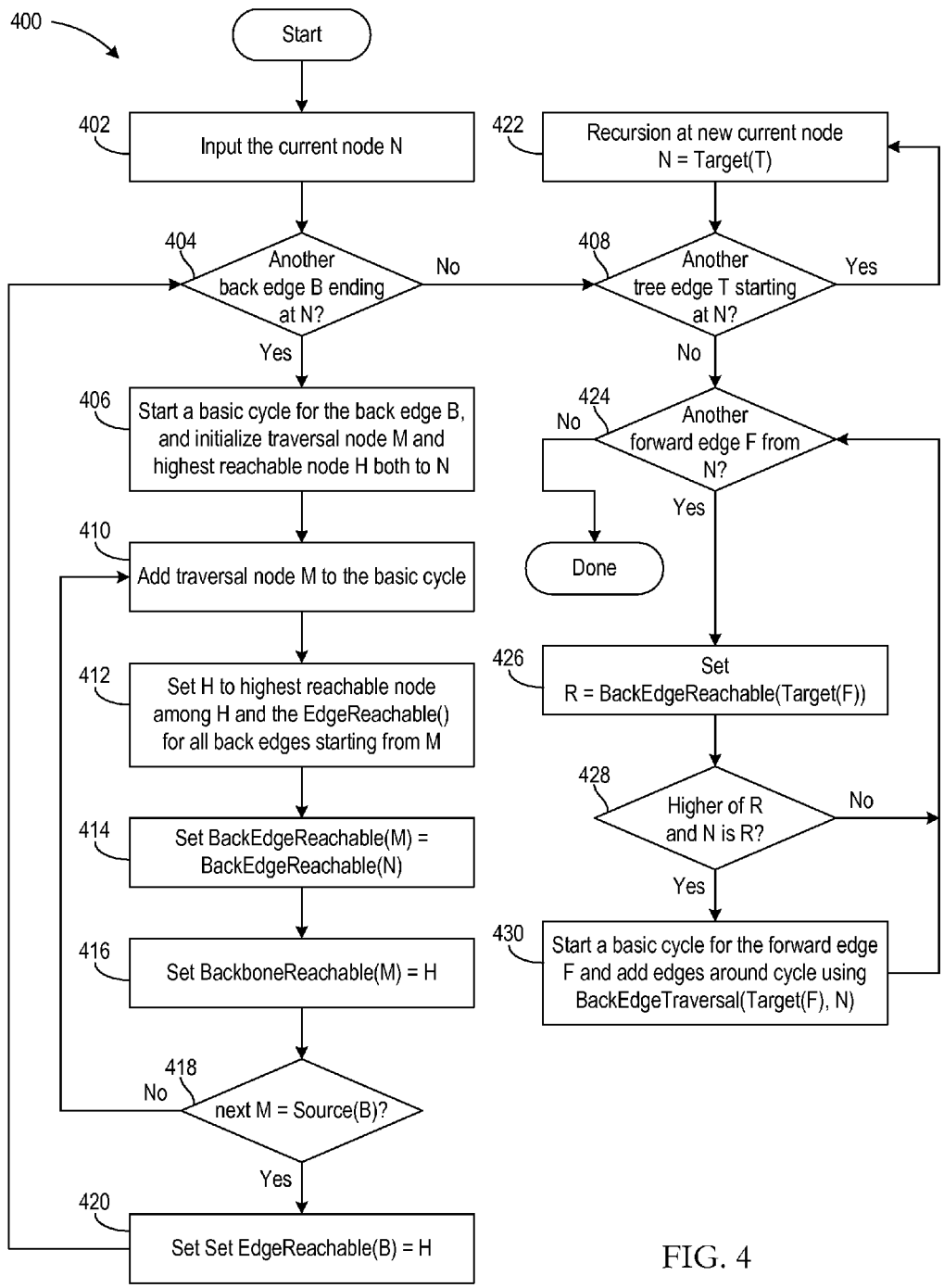
FIG. 4 is a flow diagram of a process for determining basis cycles including back edges in accordance with various embodiments of the invention.

FIG. 4 is a flow diagram of a process 400 for determining basis cycles including back edges in accordance with various embodiments of the invention. Process 400 implements a second depth-first search for determining certain basis cycles including back edges from the classification of the edges and other information associated with the nodes and edges during process 300 of FIG. 3 and dynamically during process 400.

At step 402, the current node is input. Decision 404 checks whether there is another back edge ending at the current node. If so, process 400 proceeds to step 406; otherwise process 400 proceeds to step 408.

At step 406, a basis cycle is started including the current back edge. The traversal node and the highest reachable node are both initialized to the current node. At step 410, the traversal node is added to the basis cycle. If any back edge originating at the traversal node has an EdgeReachable( ) that is higher than the highest reachable node, step 412 sets the highest reachable node to the highest EdgeReachable( ) among the back edges originating at the traversal node. At step 414, BackEdgeReachable(M) for traversal node M is set to BackEdgeReachable(N) of the current node N. At step 416, BackboneReachable(M) for the traversal node M is set to the highest reachable node.

Decision 418 checks whether the next traversal node on the path of tree edges between the current node and the source of the current back edge is the source of the current back edge. If the traversal has reached the source of the current back edge ending at the current node, process 400 proceeds to step 420; otherwise, process 400 returns to step 410 for the next traversal node. At step 420, EdgeReachable(B) for the current back edge B ending at the current node is set to the highest reachable node.

Decision 408 checks whether there is another tree edge starting at the current node. If there is another tree edge starting at the current node, process 400 proceeds to step 422 for the current tree edge; otherwise process 400 proceeds to decision 424. Step 422 recursively invokes process 400 at a new current node that is the target of the current tree edge.

Decision 424 checks whether there is another forward edge starting from the current node. If there is another forward edge, process 400 proceeds to step 426; otherwise process 400 completes. Step 426 determines the highest node reachable via back edges and tree edges from the target of the current forward edge. Decision 428 checks whether this highest reachable node is higher than the current node or is the current node. If so, process 400 proceeds to step 430; otherwise process 400 returns to decision 424. At step 430, a basis cycle is created for the forward edge using the process of FIG. 7.

Figure 5:
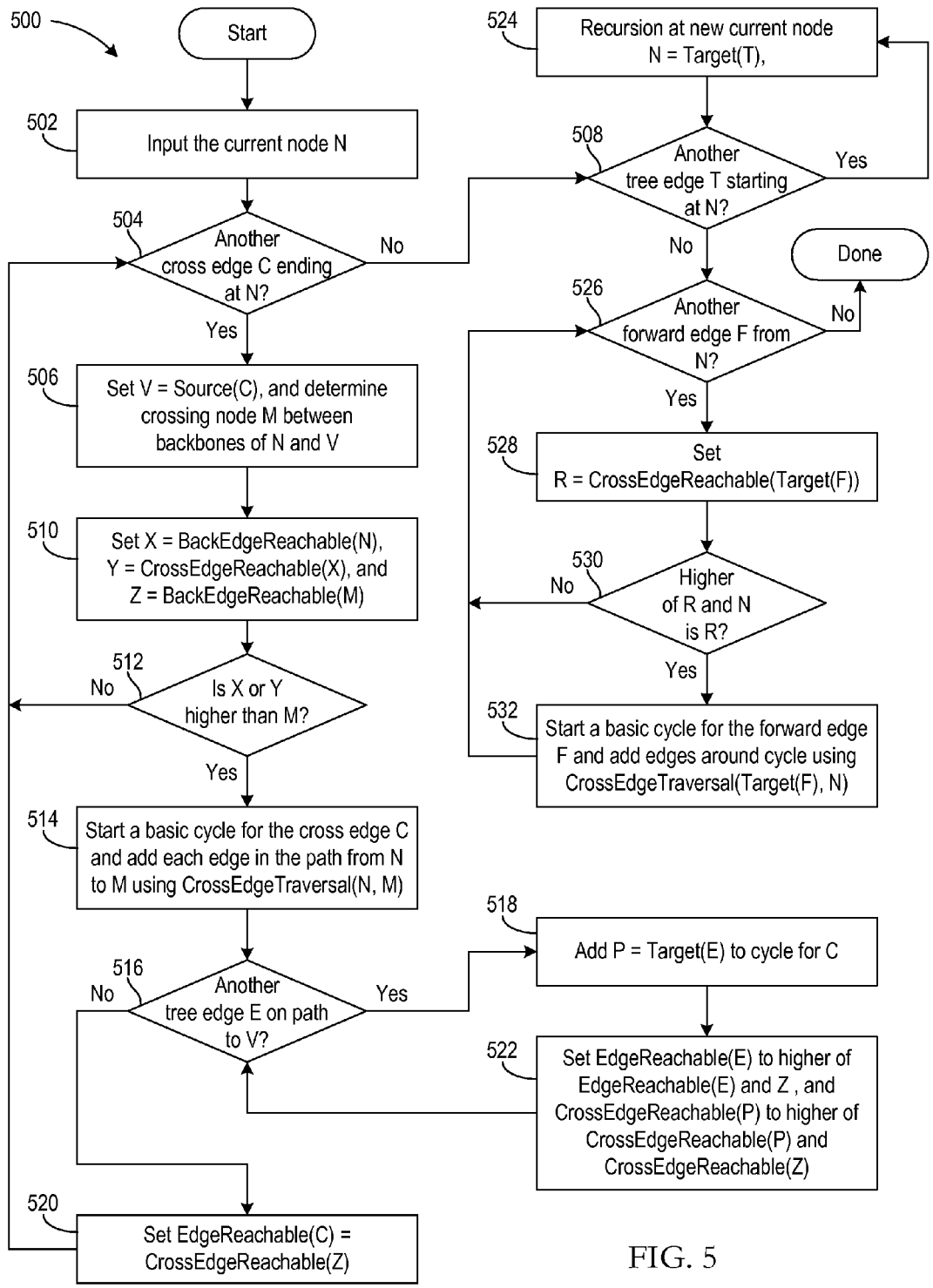
FIG. 5 is a flow diagram of a process for determining basis cycles including both back edges and cross edges in accordance with various embodiments of the invention.

FIG. 5 is a flow diagram of a process 500 for determining basis cycles including cross edges in accordance with various embodiments of the invention. Process 500 implements a third depth-first search for determining certain basis cycles including cross edges from the classification of the edges and other information associated with the nodes and edges during process 300 of FIG. 3 and process 400 of FIG. 4, and also dynamically during process 500.

At step 502, the current node is input. Decision 504 checks whether there is another cross edge ending at the current node. If there is another cross edge ending at the current node, process 500 proceeds to step 506; otherwise, process 500 proceeds to decision 508.

At step 506, the crossing node M is determined that is the lowest common ancestor of the current node N and the target V of the current cross edge ending at the current node. At step 510 node X is set to BackEdgeReachable(N), node Y is set to CrossEdgeReachable(X), and Z is set to BackEdgeReachable (M).

Decision 512 checks whether X or Y is higher than crossing node M. If so, process 500 proceeds to step 514 to create a basis cycle for the current cross edge; otherwise, the current cross edge is not included in any cycle and process 500 returns to decision 504. At step 514, a basis cycle is begin by traversing the path from the current node to the crossing node using the process of FIG. 8.

Decision 516 checks whether there is another tree edge needed to complete the cycle between the crossing node and the source of the current cross edge. If so, process 500 proceeds to step 518; otherwise process 500 proceeds to step 520. At step 518, the target P of this tree edge E is added to the basis cycle. At step 522, EdgeReachable(E) is set to the higher of EdgeReachable(E) and Z, and CrossEdgeReachable(P) is set to the higher of CrossEdgeReachable(P) and CrossEdgeReachable(Z). At step 520, EdgeReachable(C) for the current cross edge C is set to CrossEdgeReachable(Z).

Decision 508 checks whether there is another tree edge starting at the current node. For each tree edge starting at the current node, step 524 recursively invokes process 500 at the new current node of the target of the tree edge.

Decision 526 checks whether there is another forward edge originating from the current node. If so, process 500 proceeds to step 528. At step 528, the highest node reachable via the forward edge is determined. Decision 530 check whether this highest reachable node is higher than the current node or is the current node. If so, process 500 proceeds to step 532 to create a basis cycle for the forward edge using the process of FIG. 8.

Figure 6:
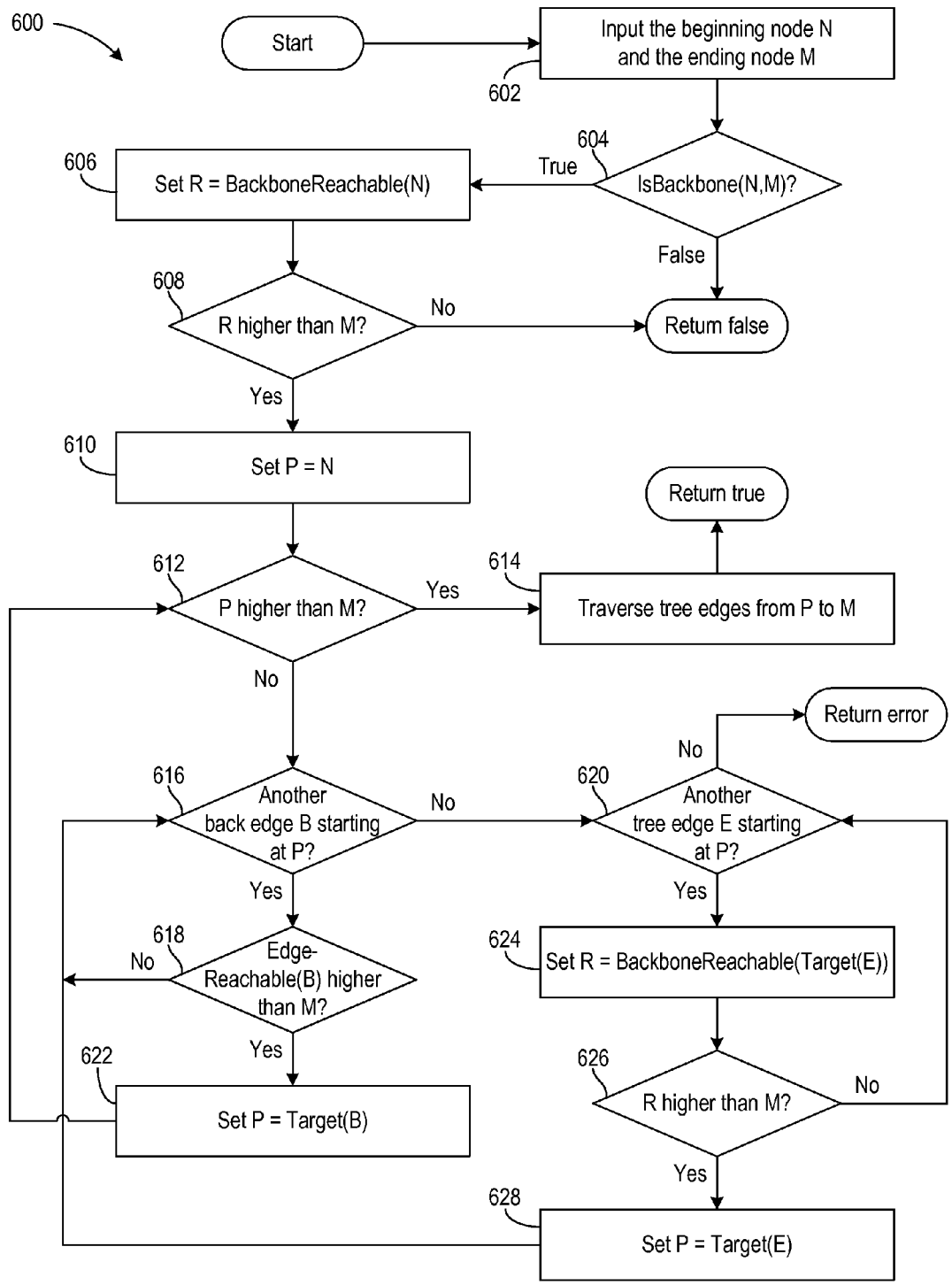
FIG. 6 is a flow diagram of a process for traversing a backbone and back edges in accordance with various embodiments of the invention.

FIG. 6 is a flow diagram of a process 600 for traversing a backbone and back edges in accordance with various embodiments of the invention.

At step 602, the beginning and ending nodes are input. Decision 604 checks whether the beginning and ending nodes are on a backbone. In one embodiment, the nodes are on a backbone if the visitation number of the ending node is within the subtree range of the beginning node. If the nodes are on a backbone, process 600 proceeds to step 606; otherwise, process 600 returns a value of false.

At step 606, the highest node is determined that is reachable via back edges and tree edges in the backbone from the beginning node to the ending node. Decision 608 checks whether this highest node is higher than the beginning node. If so, process 600 proceeds to step 610; otherwise, process 600 returns a value of false.

At step 610, a traversal node is set to the beginning node. Decision 612 checks whether the traversal node is higher than the ending node. If so, process 600 completes successfully by traversing the tree nodes from the traversal node to the ending node at step 614. Otherwise, process 600 proceeds to decision 616.

Decision 616 checks whether there is another back edge starting at the traversal node. If so, process 600 proceeds to decision 618 for the current back edge; otherwise process 600 proceeds to decision 620. Decision 618 checks whether EdgeReachable(B) for the current back edge B is higher than the ending node. If so, process 600 proceeds to step 622 to update the traversal node to the target of the current back edge and process 600 returns to decision 612. Otherwise, process 600 returns to decision 616 to check the next back edge starting from the current traversal node.

After considering all of the back edges starting from the traversal node, decision 620 checks whether there is another tree edge starting from the traversal node. Generally, process 600 then proceeds to step 624 because there is another tree edge starting from the traversal node. At step 624, the highest node is determined that is reachable from the target of the current tree edge. Decision 626 checks whether this highest node is higher than the ending node. If so, process 600 proceeds to step 628 to update the traversal node to the target of the current tree edge and process 600 returns to decision 616. Otherwise, process 600 returns to decision 620 to consider the next tree edge starting at the current traversal node.

Figure 7:
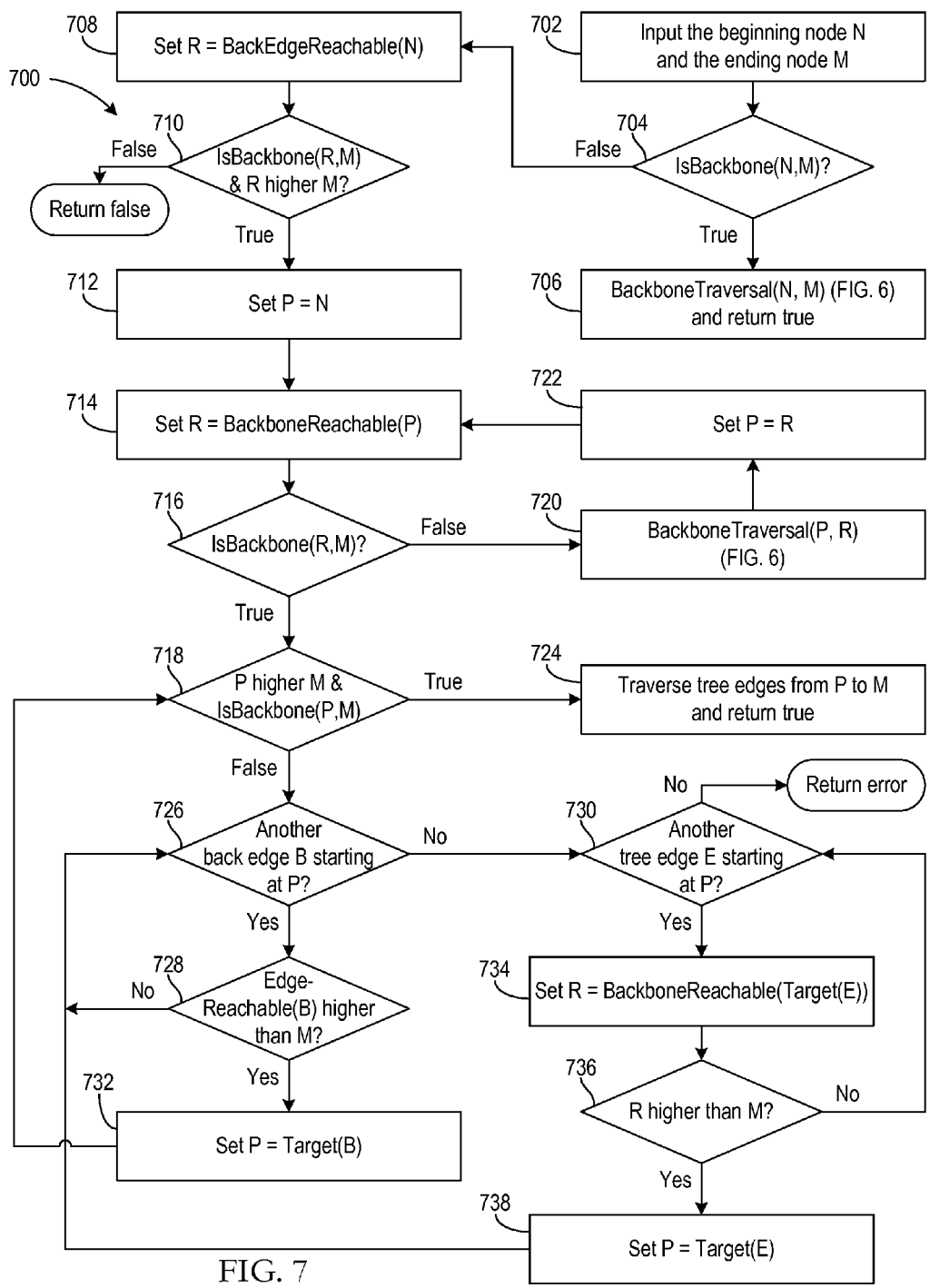
FIG. 7 is a flow diagram of a process for traversing tree and back edges in accordance with various embodiments of the invention.

FIG. 7 is a flow diagram of a process 700 for traversing tree and back edges in accordance with various embodiments of the invention.

At step 702, the beginning and ending nodes are input. Decision 704 checks whether the beginning and ending nodes are on a backbone. If the nodes are on a backbone, process 700 proceeds to step 706 to complete the traversal using the process of FIG. 6. Otherwise, process 700 proceeds to step 708. At step 708, the highest node is determined that is reachable from the beginning node by back and tree edges. Decision 710 checks whether this highest node is higher than the ending node and this highest node and the ending node are on a backbone. If so, process 700 proceeds to step 712; otherwise process 700 returns a value of false.

At step 712, a traversal node is set to the beginning node. At step 714, a highest reachable node is set to BackboneReachable(P) for traversal node P. Decision 716 checks whether this highest reachable node and the ending node are on a backbone. If so, process 700 proceeds to decision 718; otherwise process 700 proceeds to step 720. At step 720, the directed graph is traversed from the traversal node to this highest reachable node using the process of FIG. 6. At step 722, the traversal node is updated to be this highest reachable node.

Decision 718 checks whether the traversal node is higher than the ending node and the traversal and ending nodes are on a backbone. If so process 700 proceeds to step 724; otherwise process 700 proceeds to step 726. Steps 724 through 738 of FIG. 7 correspond to steps 614 through 628 of FIG. 6.

Figure 8:
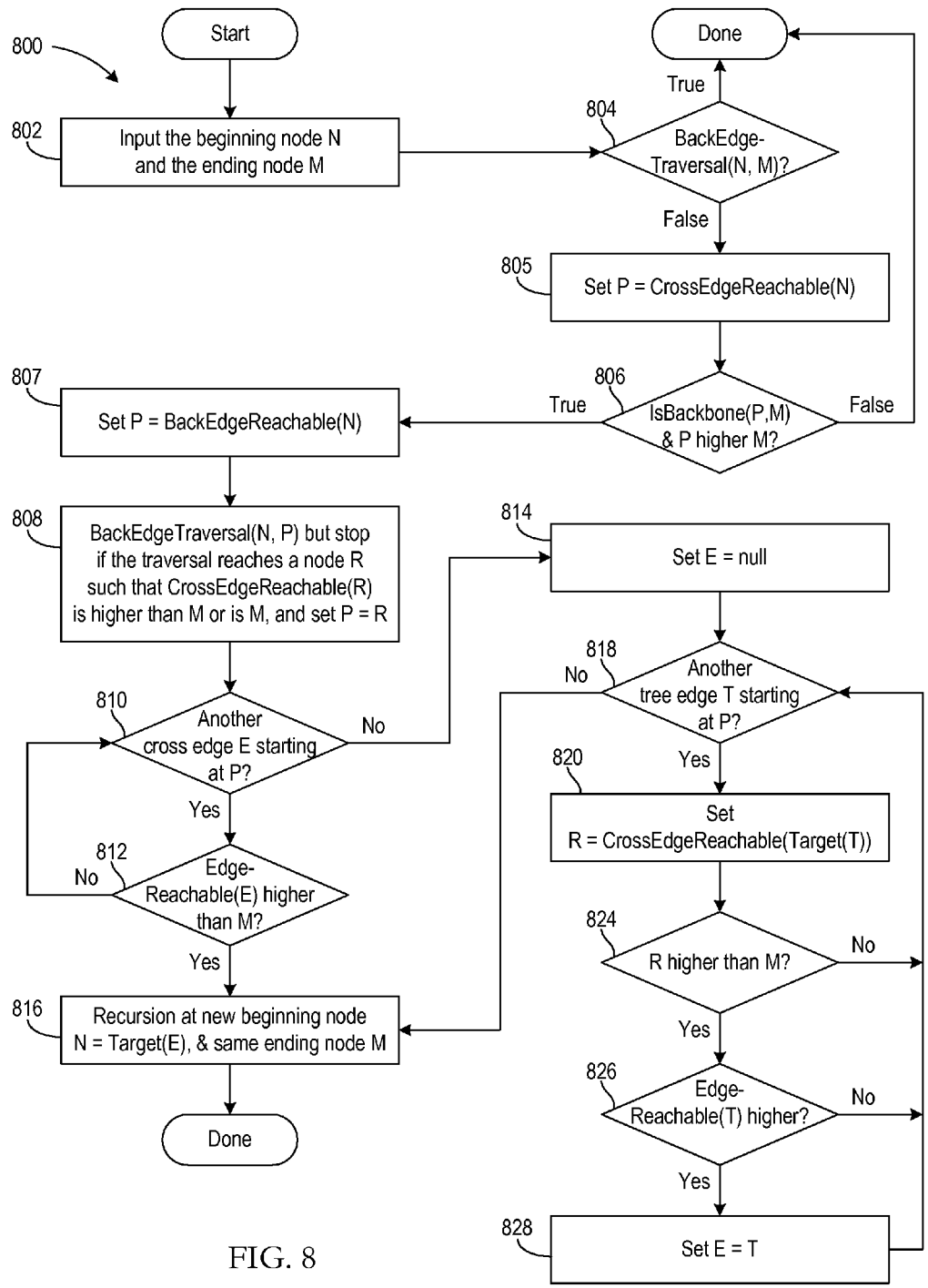
FIG. 8 is a flow diagram of a process for traversing a directed graph in accordance with various embodiments of the invention.

FIG. 8 is a flow diagram of a process 800 for traversing a directed graph in accordance with various embodiments of the invention.

At step 802, the beginning and ending nodes are input. Decision 804 checks whether the traversal can be successfully completed using the process of FIG. 7. If the traversal requires traversal of a cross edge, process 800 proceeds to step 805. At step 805, a traversal node is set to CrossEdgeReachable(N) for beginning node N. Decision 806 checks whether this traversal node is higher than the ending node and this highest node and the ending node are on a backbone. If so, process 800 proceeds to step 807; otherwise process 800 completes.

At step 807, a traversal node is set to BackEdgeReachable (N) for beginning node N. At step 808, the process of FIG. 7 is invoked for determining a path from the beginning node to the traversal node, but the process is interrupted during the traversal if a node R is reached having CrossEdgeReachable (R) that is at least as high as the ending node, and if such a node R is reached, the traversal node is set to R.

Decision 810 checks whether there is another cross edge starting from the traversal node. If so, process 800 proceeds to decision 812; otherwise process 800 proceeds to step 814. Decision 812 checks whether EdgeReachable(E) for current cross edge E is higher than the ending node. If so, process 800 completes at step 816 by recursively invoking process 800 at the same ending node and a new beginning node that is the target of the current cross edge.

Step 814 initializes a best tree edge to a null edge. Decision 818 checks whether there is another current tree edge starting at the traversal node. If so, process 800 proceeds to step 820; otherwise, process 800 completes at step at step 816 by recursively invoking process 800 at the same ending node and a new beginning node that is the target of the best tree edge.

Step 820 sets a reachable node to the highest node that is known to be reachable from the target of the current tree edge. Decision 824 checks whether this reachable node is higher than the ending node. If so, process 800 proceeds to decision 826; otherwise, process 800 returns to decision 818. Decision 826 checks whether EdgeReachable(T) for current tree edge T is higher than any other current tree edge previously checked at decision 826. If so, process 800 proceeds to step 828 and the current tree edge becomes the best tree edge originating from the traversal node.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of systems for determining a cycle basis. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for determining a basis for a plurality of cycles within a directed graph, comprising:
    inputting a specification of the directed graph, the directed graph modeling a circuit and including a plurality of nodes that represent circuit elements of the circuit and including a plurality of edges that represent connections between the circuit elements and that are each directed from one to another of the nodes;
    performing, using a processor, a first depth-first search of the directed graph,
    wherein nodes and edges visited in the first depth-first search form a tree, and
    wherein the first depth-first search classifies each of the edges of the directed graph to have a type that is one of a within-tree type for an edge within the tree, a forward type for an edge skipping forward along the tree, a back type for an edge directed back along the tree, or a cross type for an edge between two subtrees of the tree;
    performing a second depth-first search of the directed graph that determines a respective first cycle for each of the edges of the back type,
    wherein the respective first cycle is a cycle of the edge of the back type and at least one edge of the within-tree type;
    performing a third depth-first search of the directed graph that determines a respective second cycle for each of the edges of the cross type included a cycle,
    wherein the respective second cycle is a cycle of the edge of the cross type and a plurality of edges of the within-tree, back, or cross types; and
    outputting the basis that specifies each of the respective first cycles and each of the respective second cycles.

2. The method of claim 1, wherein the basis of the plurality of cycles in the directed graph is a basis of the cycles that only include edges of the within-tree, back, and cross types.

3. The method of claim 2, wherein the performing the first depth-first search includes performing the first depth-first search that classifies each of the edges of the directed graph to have a type that is one of the within-tree type for an edge of the tree, the forward type for an edge paralleling a connected sequence of edges of the tree, the back type for an edge reverse paralleling a connected sequence of one or more edges of the tree, or the cross type for any other edge between two nodes of the tree.

4. The method of claim 1, wherein the performing the first depth-first search includes performing the first depth-first search that starts at one of the plurality of nodes that is a root node of the tree of the first depth-first search, and the tree has edges traversed during the first depth-first search for visiting nodes that are not already visited.

5. The method of claim 1, wherein the performing the first depth-first search includes performing the first depth-first search that determines a plurality of trees that include the nodes reachable from respective root ones of the nodes, and the tree of the depth-first search is any one of the plurality of trees.

6. The method of claim 1, wherein the performing the first depth-first search includes performing the first depth-first search that classifies each of the edges of the directed graph to have a type that is one of the within-tree type of a tree of the first depth-first search, the forward type of a tree of the first depth-first search, the back type of a tree of the first depth-first search, the cross type of a tree of the first depth-first search, or a cross-tree type for an edge between two of a plurality of trees of the first depth-first search.

7. The method of claim 1, wherein the performing the second depth-first search includes, at each first node of the tree, generating the respective first cycle for each of the edges having the back type and directed to the first node from a second node of the tree, the respective first cycle being a cycle of the edge of the back type and a connected sequence from the first node to the second node of one or more edges of the within-tree type.

8. The method of claim 1, wherein the performing of the first depth-first search includes associating an ordinal number with each of the nodes for identifying a position of the node in an order of visiting the nodes during the first depth-first search, and
    wherein the performing the second depth-first search includes associating information with each node along each respective first cycle, the information including the ordinal number of a node that is foremost in the order among the nodes reachable from the nodes along the respective first cycle by a connected sequence of at least one edge of the within-tree or back types.

9. The method of claim 1, wherein the performing the third depth-first search includes associating information with each node along each respective second cycle, the information including an ordinal number of a node that is foremost in the order among the nodes reachable from the nodes along the respective second cycle by a connected sequence of at least one edge of the within-tree, back, or cross types.

10. The method of claim 1, wherein the performing the third depth-first search includes, at each first node of the tree, checking each of the edges having the cross type and directed to the first node from a second node of the tree, the checking including checking whether the edge is included in a cycle from information associated with the first and second nodes, and in response to the edge being included in a cycle, generating the respective second cycle that is a cycle of the edge of the cross type and a connected sequence from the first node to the second node of a plurality of edges of the within-tree, back, or cross types.

11. The method of claim 1, further comprising determining a respective third cycle for each of the edges of the forward type that is included in a cycle, wherein the respective third cycle is a cycle of the edge of the forward type and at least one edge of the within-tree, back, or cross types, and the outputting of the basis includes outputting the basis that specifies each of the respective first, second, and third cycles.

12. The method of claim 11, wherein the determining the respective third cycle for each edge of the forward type that is included in a cycle includes, at each first node of the tree, checking each of the edges having the forward type and directed to the first node from a second node of the tree, the checking including checking whether the edge is included in a cycle from information associated with the first and second nodes, and in response to the edge being included in a cycle, generating the respective second cycle that is a cycle of the edge of the forward type and a connected sequence from the first node to the second node of a plurality of edges of the within-tree, back or cross types.

13. The method of claim 11, wherein every cycle of the directed graph is a linear combination of the respective first, second, and third cycles, and the respective first, second, and third cycles are linearly independent.

14. The method of claim 11, wherein the performing the first, second, and third depth-first searches, the determining the respective third cycle for each edge of the forward type that is included in a cycle, and the outputting the basis require an amount of computation that is linear in a number of nodes of the directed graph, a number of edges in the directed graph, and a number of edges in the respective first, second, and third cycles.

15. The method of claim 1, further comprising inputting a specification of the directed graph, wherein the outputting of the basis includes producing in a memory a specification of the respective first cycle for each of the edges of the back type, and producing in the memory a specification of the second respective cycle for each of the edges of the cross type that is included a cycle.

16. An article of manufacture, comprising:
a non-transitory processor-readable storage device configured with instructions for determining a basis for a plurality of cycles within a directed graph, wherein execution of the instructions by one or more processors causes the one or more processors to perform operations including:
inputting a specification of the directed graph, the directed graph modeling a circuit and including a plurality of nodes that represent circuit elements of the circuit and including a plurality of edges that represent connections between the circuit elements and that are each directed from one to another of the nodes;
performing a first depth-first search of the directed graph,
wherein nodes and edges visited in the first depth-first search form a tree, and
wherein the first depth-first search classifies each of the edges of the directed graph to have a type that is one of a within-tree type for an edge within the tree, a forward type for an edge skipping forward along the tree, a back type for an edge directed back along the tree, or a cross type for an edge between two subtrees of the tree;

performing a second depth-first search of the directed graph that determines a respective first cycle for each of the edges of the back type,
wherein the respective first cycle is a cycle of the edge of the back type and at least one edge of the within-tree type; and
performing a third depth-first search of the directed graph that determines a respective second cycle for each of the edges of the cross type included a cycle,
wherein the respective second cycle is a cycle of the edge of the cross type and a plurality of edges of the within-tree, back, or cross types.

17. The article of manufacture of claim 16, wherein the performing the second depth-first search includes, at each first node of the tree, generating the respective first cycle for each of the edges having the back type and directed to the first node from a second node of the tree, the respective first cycle being a cycle of the edge of the back type and a connected sequence from the first node to the second node of one or more edges of the within-tree type.

18. The article of manufacture of claim 16, wherein the performing the third depth-first search includes, at each first node of the tree, checking each of the edges having the cross type and directed to the first node from a second node of the tree, the checking including checking whether the edge is included in a cycle from information associated with the first and second nodes, and in response to the edge being included in a cycle, generating the respective second cycle that is a cycle of the edge of the cross type and a connected sequence from the first node to the second node of a plurality of edges of the within-tree, back, or cross types.

19. The article of manufacture of claim 16, wherein the execution of the instructions for the operations of performing of the first, second, and third depth-first searches takes an amount of time that is linear in a number of nodes of the directed graph, a number of edges in the directed graph, and a number of edges in the respective first and second cycles.

20. A system for determining a basis for a plurality of cycles within a directed graph, comprising:
at least one processor;
a memory arrangement coupled to the at least one processor and configured with instructions that when executed by the at least one processor cause the at least one processor to perform operations including:
inputting a specification of the directed graph, the directed graph modeling a circuit and including a plurality of nodes that represent circuit elements of the circuit and including a plurality of edges that represent connections between the circuit elements and that are each directed from one to another of the nodes;
performing a first depth-first search of the directed graph,
wherein nodes and edges visited in the first depth-first search form a tree, and
wherein the first depth-first search classifies each of the edges of the directed graph to have a type that is one of a within-tree type for an edge within the tree, a forward type for an edge skipping forward along the tree, a back type for an edge directed back along the tree, or a cross type for an edge between two subtrees of the tree;

performing a second depth-first search of the directed graph that determines a respective first cycle for each of the edges of the back type, wherein the respective first cycle is a cycle of the edge of the back type and at least one edge of the within-tree type;

performing a third depth-first search of the directed graph that determines a respective second cycle for each of the edges of the cross type included a cycle, wherein the respective second cycle is a cycle of the edge of the cross type and a plurality of edges of the within-tree, back, or cross types; and outputting the basis that specifies each of the respective first and second cycles.

* * * * *